United States Patent

Koyama et al.

[11] Patent Number: 6,118,122
[45] Date of Patent: *Sep. 12, 2000

[54] ION BEAM WORKING APPARATUS

[75] Inventors: Yoshihiro Koyama; Yasuhiko Sugiyama, both of Chiba, Japan

[73] Assignee: Seiko Instruments, Inc., Chiba, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/922,892

[22] Filed: Sep. 3, 1997

[30] Foreign Application Priority Data

Sep. 30, 1999 [JP] Japan ................... 8-259559

[51] Int. Cl.⁷ ................................... H01J 37/28
[52] U.S. Cl. ............... 250/309; 250/307; 250/492.21
[58] Field of Search ............... 250/309, 492.21, 250/505.1, 398, 307

[56] References Cited

U.S. PATENT DOCUMENTS

| | | |
|---|---|---|
| Re. 33,193 | 4/1990 | Yamaguchi et al. ............ 250/309 |
| 4,443,704 | 4/1984 | Yamashita et al. ............ 250/491.1 |
| 4,503,329 | 3/1985 | Yamaguchi et al. ............ 250/309 |
| 4,609,809 | 9/1986 | Yamaguchi et al. ............ 219/121 |
| 4,857,742 | 8/1989 | Kato et al. ............ 250/491.1 |
| 5,065,034 | 11/1991 | Kawanami et al. ............ 250/505.1 |
| 5,120,925 | 6/1992 | Ohnishi et al. ............ 250/492.21 |
| 5,350,920 | 9/1994 | Fukuyama et al. ............ 250/309 |
| 5,401,974 | 3/1995 | Oae et al. ............ 250/424 |
| 5,449,915 | 9/1995 | Yamada et al. ............ 250/398 |
| 5,532,494 | 7/1996 | Kawanami et al. ............ 250/491.1 |
| 5,616,921 | 4/1997 | Talbot et al. ............ 250/492.21 |
| 5,689,117 | 11/1997 | Nakasuji ............ 250/398 |
| 5,831,274 | 11/1998 | Nakasuji ............ 250/492.23 |
| B1 4,609,809 | 1/1993 | Yamaguchi et al. ............ 250/492.2 |

*Primary Examiner*—Bruce Anderson
*Attorney, Agent, or Firm*—Hogan & Hartson LLP

[57] ABSTRACT

An ion beam working apparatus which can carry out a plurality of workings with good accuracy automatically is provided. When an ion beam current is changed, by setting differences in ion beam optical conditions, working without focal point shift or working position shift becomes possible and throughput increases can be expected. Differences in ion beam optical conditions of when an ion beam current is changed are stored in a computer and when the ion beam current amount is changed midway through automatic working those stored differences in ion beam optical conditions are set in the ion beam optical system.

11 Claims, 2 Drawing Sheets

ION BEAM WORKING APPARATUS

BACKGROUND OF THE INVENTION

This invention relates to an ion beam working apparatus for carrying out fine working of a sample surface using focused ion beam irradiation.

Conventionally, as is in Japanese Patent Publication No. H.3-163741, it was a working method wherein an optimum aperture diameter corresponding to the size of a working area of working using focused ion beam irradiation is stored in a computer and working conditions are selected and set from those stored conditions and working is carried out.

With this apparatus working of a sample surface is carried out in the following way, by means of radiation of a focused ion beam onto the sample surface image observation of the sample surface is carried out, on the basis of this image observation a focused ion beam irradiation area (scanning area) is set, and the focused ion beam is scan-radiated in the irradiation area. At the sample surface irradiated with the focused ion beam, by ion sputtering, the surface of the focused ion beam irradiation area (the scanned area) is removed. Also, if simultaneously with the focused ion beam radiation an organic compound vapor is blown against that area, organic compound adsorbed onto the sample surface is decomposed by the ion beam irradiation and a solid thin film is formed on that area.

Also, if instead of an organic compound vapor a vapor of a substance having an etching action with respect to the substance constituting the sample is blown against it, the substance constituting the sample and that vapor are caused by the focused ion beam irradiation to react and faster etching removal working can be carried out.

With a conventional method, the ion beam current is selected according to the size of the working area, and throughput is thereby increased, but when the ion beam current is changed a shift in the focal point and a shift in the image occur. Because of this, it was not possible to carry out continuous working of a plurality of workings with good accuracy automatically. In particular, the focused ion beam is radiated onto the sample surface with predetermined focused ion beam irradiation conditions, the sample surface is observed and on the basis of that sample observation image the focused ion beam irradiation area (working area) is set. After that, the focused ion beam radiation conditions (the opening diameter of the electric variable multi-aperture) are changed and the focused ion beam is scan-radiated onto the irradiation area again and the sample surface is worked. When the opening diameter of the electric variable multi-aperture is changed, the ion beam current of the focused ion beam changes, and the irradiation locus of the focused ion beam also shifts. Therefore, when the sample surface is worked using focused ion beam irradiation in the observed image, the worked area differs from the target area and correct working cannot be performed. To eliminate this shift, it is necessary to scan-radiate the focused ion beam and carry out image observation and set the working area again with the changed opening diameter of the electric variable multi-aperture.

SUMMARY OF THE INVENTION

In this invention, differences between different ion beam current amounts such as ion beam optical conditions such as focal point and image shift amounts are stored in a computer in correspondence with ion beam current amounts to be used, conditions are selected from these stored files, and shift of focal point and shift of image and the like are corrected by the ion beam optical system being set to those condition values.

Continuous working of a plurality of workings with high accuracy automatically becomes possible and it was possible to increase throughput.

BRIEF DESCRIPTION OF THE DRAWINGS

FIG. 2 is plan views of a sample surface for illustrating a first embodiment of the invention.

FIG. 3 is plan views of a sample surface for illustrating a second embodiment of the invention.

EMBODIMENT

Embodiments of the invention will now be described.

[Embodiment 1]

Figure 1:
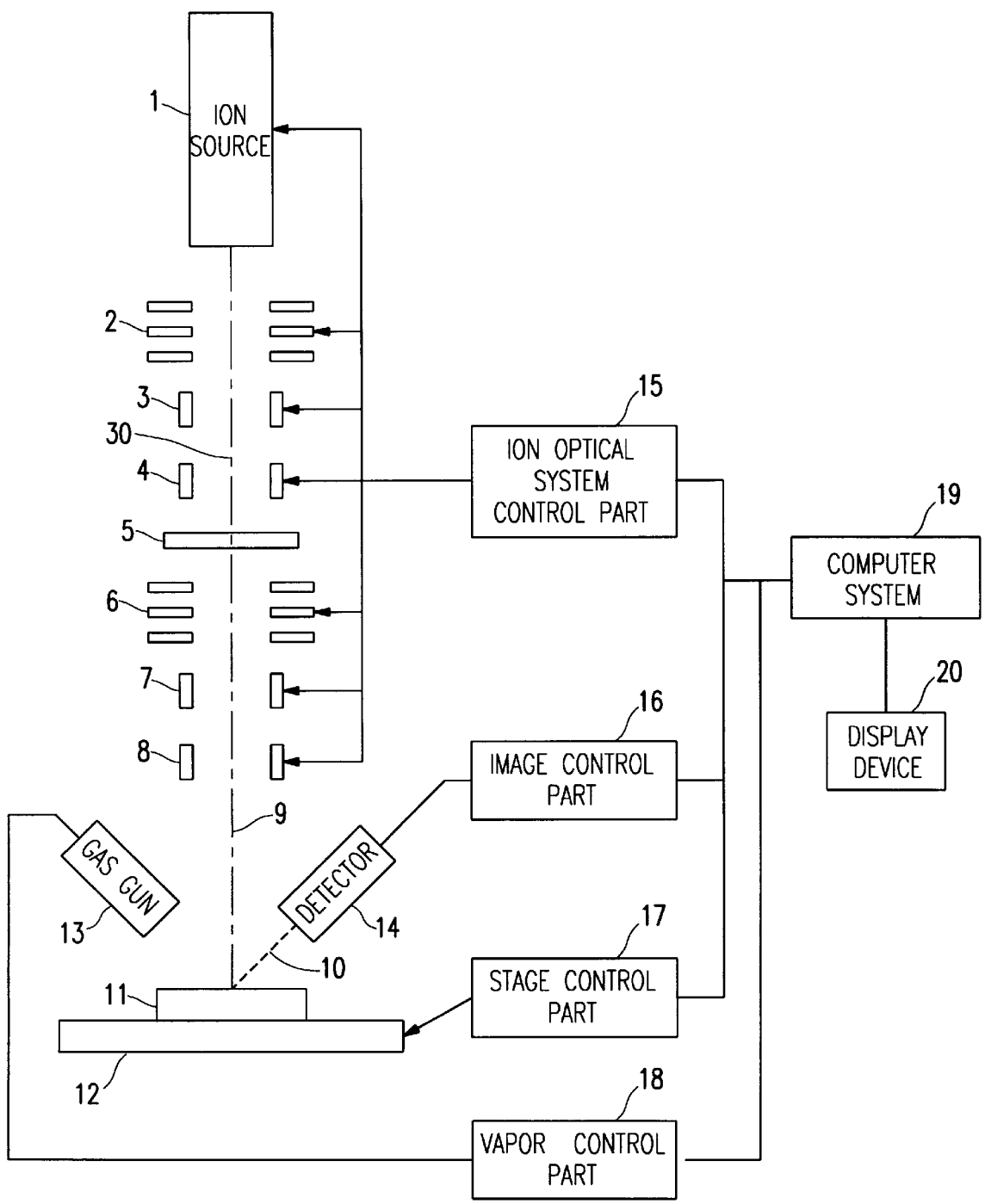
FIG. 1 is an outline block diagram of a focused ion beam working apparatus.

FIG. 1 is a block view of a focused ion beam working apparatus. Ions are produced as a beam from an ion source 1. For the ion source 1, normally a liquid metal ion source is used. The ion beam is focused by a focusing lens 2 and an objective lens 6 disposed along its beam axis 30 so that it becomes of a small spot diameter as a focused ion beam 9 at the surface of a sample 11. Also, the focused ion beam 9 is deflected by scanning electrodes 8 disposed along the beam axis 30 so that it scans in a predetermined area. The scanning electrodes 8 are provided in two pairs to deflect the focused ion beam 9 in an X direction and a Y direction. An astigmatism correcting electrode 7 disposed along the beam axis 30 is for correcting astigmatism (beam cross-section diameter flattening) of the focused ion beam 9, and a blanking electrode 3 greatly moves the focused ion beam 9 away from the beam axis 30 to stop radiation of the focused ion beam 9 onto the sample 11 surface.

Also, an electric variable multi-aperture 5 is disposed on the beam axis 30. The electric variable multi-aperture 5 is an aperture provided with a row of holes having various opening diameters, and the electric variable multi-aperture 5 can be moved in the row direction by means of a motor or the like (not shown). By movement of the electric variable multi-aperture 5 it is possible to switch an aperture hole diameter passing the beam axis 30 and thereby switch the ion current of the focused ion beam 9.

Further, an alignment electrode 4 is disposed along the beam axis 30, and on the basis of a signal from an ion optical system control part 15 the alignment electrode 4 shifts the radiation locus of the focused ion beam 9 by a predetermined amount.

To detect secondary charged particles 10 arising from the sample 11 surface irradiation position of the focused ion beam 9, a secondary charged particle detector 14 is disposed pointing toward the focused ion beam 9 irradiation position. A signal from the secondary charged particle detector 14 undergoes signal processing such as binarization and contrast by an image control part 16 and is inputted into a computer system 19. The state of the sample 11 surface is image-displayed on a display device 20 connected to the computer system 19 on the basis of the strength of the secondary charged particles 10 detected by the secondary charged particle detector 14.

The sample 11 is mounted in a sample stage 12. On the basis of a signal from the stage control part 17, the sample stage 12 effects predetermined XYZ direction movement of the sample 11, rotation of the sample 11 about a normal to the XY plane as an axis, and tilting/rotation on the two axes XY.

A gas gun 13 is for blowing an organic compound vapor or a vapor having etching characteristics onto the focused ion beam 9 irradiation position of the surface of the sample 11. By a compound vapor or a vapor having etching characteristics from the gas gun 13 being blown simultaneously with irradiation of the focused ion beam 9 of the sample 11 surface, compound adsorbed onto the sample 11 surface is decomposed by the focused ion beam 9 and a pattern film is formed on the focused ion beam 9 irradiation area or is removed by etching (accelerated etching). The pattern film, when a metal component is not included in the compound, becomes a carbide film and when a metal component is included becomes a metal film. On/off of the blowing of the compound vapor from the gas gun 13 and the gas flow when it is on are controlled by the computer system 19 by way of a vapor control part 18.

When the gas gun 13 is on, a pattern film is formed in a predetermined area of the surface of the sample 11 or is acceleratedly etched, and when the gas gun 13 is off a predetermined area of the surface of the sample 11 is removed by etching. If the area removed by etching is a pattern film formed on the surface of the sample 11, it is also possible to remove and correct a part of the pattern of the pattern film. It is also possible to carry out cross-section working for observing the cross-section of a pattern film or the sample 11 surface part.

Here, when working a sample 11 using a focused ion beam working apparatus, to raise throughput it is necessary to suitably change the ion current of the focused ion beam 9 of the time of working according to whether it is removal working for correction of the pattern shape of a pattern film, removal working for cross-section observation, quality of material of removal working, film laying of carbide film, film laying working of metal film, as well as working surface area and working accuracy. In other words, for each working there is a respective suitable focused ion beam current.

After the sample 11 surface is image-observed by scanning-radiation of the focused ion beam 9 and the working area is determined, for a predetermined working area only an ion current is suitably set. To set the ion current, of the plurality of openings provided in the electric variable multi-aperture 5 one of a suitable opening diameter is switched to. It is also possible to change the ion current by switching the impressed voltage of the focusing lens 2. Here, when the ion current is switched and radiation of the focused ion beam 9 is carried out, the beam axis 30 of the focused ion beam 9 may shift (shift in the XY direction), the focal point position may slip from the sample 11 surface position (Z direction), and the cross-sectional shape of the focused ion beam 9 perpendicular to its axis may change from a circle to an ellipse. Here, adjustment of the ion beam optical system is carried out.

As ion beam optical system adjustments, it is adjustment of current amount, beam alignment, focal point, astigmatism and so on. Adjustment of current amount may be accomplished by changing the impressed voltage of the focusing lens 2 and/or the aperture diameter of the electric variable multi-aperture 5. Specifically, beam alignment correction means correcting a shift (beam shift of the axis) of the axis 30 of the beam accompanying as a result of, for example the impressed voltage of the focusing lens 2 being changed, and may be accomplished by impressing a voltage on the alignment electrode 4. When the beam current is adjusted by the aperture diameter of the electric variable multi-aperture 5 being changed, the beam axis 30 below the aperture of the electric variable multi-aperture 5 achieves the shift as far as the sample 11 surface (shift of radiation axis) by superimposing a DC component on the scanning signal inputted into the scanning electrodes 8 to offset the beam radiation position. Focal point correction may be accomplished by changing the impressed voltage of the objective lens 6 so that the beam focuses on the sample 11. Also, astigmatism correction includes making the cross-sectional shape of the focused ion beam 9 focused by the objective lens 6 round, and may be accomplished by changing the voltage impressed on the astigmatism correcting electrode 7. To adjust the ion beam optical system, observation of the beam is indispensable, but because there are various conventional ways of doing this a description will be omitted here.

Different combinations of the impressed voltage of the focusing lens 2 and the used opening diameter of the electric variable multi-aperture 5 are taken and adjustment of the ion beam optical system is carried out for each of these conditions. That is, the voltage impressed on the alignment electrode 4, the voltage impressed on the objective lens 6 and the voltage impressed on the astigmatism correcting electrode 7 are found so that a focused circular beam spot irradiates the surface of the sample 11 without shifting from the beam axis 30. The values of this adjusted ion beam optical system are stored in the computer system 19.

Figure 2A:
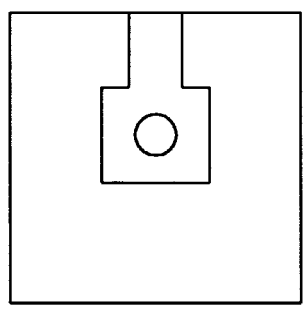
FIG. 2a is before aperture switching.
Figure 3A:
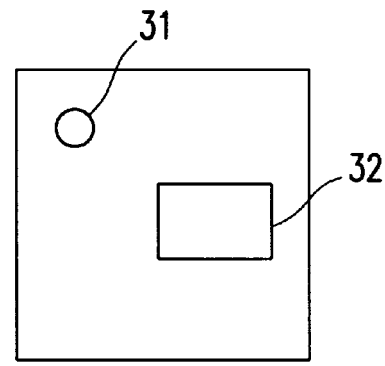
FIG. 3a is during setting of a reference point and working.
Figure 2B:
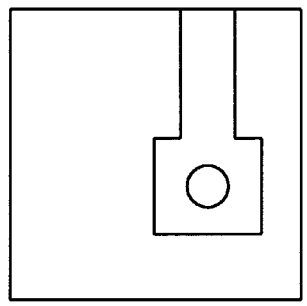
FIG. 2b is immediately after aperture switching (the image has been shifted as a result of aperture switching)
Figure 2C:
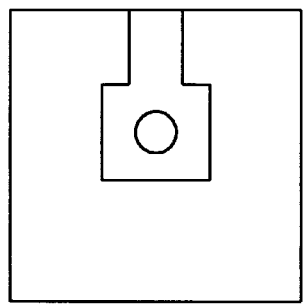
FIG. 2c is after correction has been carried out by beam shifting.

Here, for example, when to set an ion current value the opening diameter of the electric variable multi-aperture 5 has been switched, in an image displayed on the display device 20, a position shift of the beam irradiation position occurs as from FIG. 2a to FIG. 2b. A shift in the image based on this shift of the beam axis 30 caused by this difference between aperture opening diameters is achieved by a DC component being superimposed on the scanning signal inputted into the scanning electrodes 8 to offset the beam radiation position. That is, by adjustment being carried out as shown in FIG. 2c the beam is made to be radiated in the same position as in FIG. 2a and these adjusted values are stored in the computer system 19.

Next, after the sample is observed, the position of the working area and the working area are set. These position and working area set values are stored in the computer system 19 and on the basis of the position and working area set values, so that the focused ion beam 9 scans-irradiates the predetermined area, a scanning signal is inputted from the ion optical system control part 15 into the scanning electrodes 8. Next, the type of the working (such as whether it is observation, removal working for pattern shape correction or cross-section observation, metal or light-blocking film laying working, working surface area, removed material at time of removal working) is inputted into the computer system 19. In the computer system 19, impressed voltages of the focusing lens 2, and opening diameters of the electric variable multi-aperture 5 suited to these conditions are stored. The impressed voltage of the focusing lens 2 and the opening diameter of the electric variable multi-aperture 5 are set by way of the ion optical system control part 15 so as to become those stored values.

When the impressed voltage of the focusing lens 2 and the opening diameter of the electric variable multi-aperture 5 are set by way of the ion optical system control part 15 so as to become those stored values, adjustment of the ion beam optical system becomes necessary. A voltage to be impressed on the alignment electrode stored in the computer system 19 for adjustment of shift of the axis 30, a voltage to be impressed on the objective lens 6 for focal point adjustment, a voltage to be impressed on the astigmatism correcting electrode 7 for astigmatism correction, and a DC component impression correction superimposed to the scanning electrodes 8 for correcting shift in the radiation of the focused ion beam 9 onto the sample 11 are impressed by way of the ion optical system control part 15.

Also, according to the working conditions of whether it is removal working or film laying working (film quality and the like also) inputted into the computer system 19, the gas gun 13 is set on or off by way of the ion optical system control part 15.

As the setting of the working area, not only setting within one screen but a discretized plurality of workings is also possible with the sample stage 12 being moved, and is carried out by stage position information also being stored in the computer system 19 together with working content when stage movement is carried out and the working area is determined. Also, when setting the working area, when the sides of the working area, which is usually set in a rectangle, are not parallel with the main scanning direction of the focused ion beam and have an incline, on the basis of that inclination angle the scanning direction of the focused ion beam is inclined. That is, one side of the working area, which is rectangular, and the main scanning direction of the focused ion beam are made parallel. By doing this, it is possible to set the working area easily. Concerning conversion of the scanning signal, because it is disclosed in Japanese Unexamined Patent Publication No. S.63-241953, here a description of the conversion formula will be omitted. When there are a plurality of working areas, so that they become main and auxiliary scanning directions of the focused ion beam parallel with the respective areas, conversion formulas corresponding to the respective areas are stored in the computer system 19. By this means, with respect to all the working areas, it is possible to carry out continuous working. Furthermore, by prestoring beam current amounts by opening diameter of the electric variable multi-aperture and etching rates by material in the computer system 19 and inputting the depth to which working is to be carried out and the computer calculating and displaying the number of scans and the working time with each opening diameter, selection taking into account working time and waste of working and so on.

When a set working is carried out according to working content stored in the computer, ion beam optical system conditions prestored in the computer system 19 are selected each time the current amount of the ion beam is changed, and by setting the ion beam optical system to those conditions it is possible to carry out continuous working without working position shift or the like.

[Embodiment 2]

In this embodiment, a method for carrying out working with good accuracy in continuous working accompanying sample stage 12 movement will be described.

In working accompanying sample stage 12 movement, absolute accuracy of the stage becomes necessary. However, in the sample stage 12, production of a stage of absolute accuracy of ±0.05 μm or less is difficult, and with present stage accuracy it is difficult to carry out working with good accuracy accompanying stage movement. To overcome this, when setting a working area 31, something having a characteristic shape and contrast (hereinafter abbreviated to reference point) in the vicinity of the working area 31 of the sample 11 of the kind of FIG. 3c and the positional relationship and working conditions of the reference point 32 and the working area 31 are stored at the same time. As this reference point 32, a hole made by working the sample by means of a focused ion beam or a secondary charged particle image contrast difference caused by irregularity of the surface of the working object or a difference in materials constituting the working object and the like are conceivable.

Figure 3B:
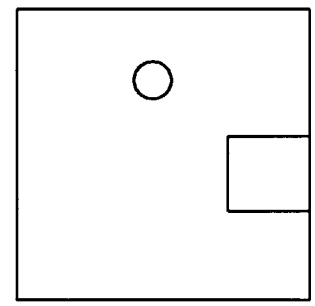
FIG. 3b is when the reference point has shifted as a result of stage movement.
Figure 3C:
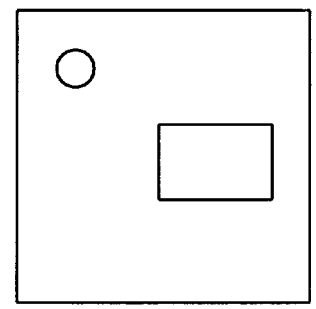
FIG. 3c is after the position shift of the reference point has been corrected by beam shifting.

After working condition setting, when working is to be carried out, because it is working accompanying sample stage 12 movement the beam radiation position shifts as shown in FIG. 3b due to the stage accuracy problem. First, on the basis of the working position stored in the computer system 19, by way of the stage control part 17, the sample stage 12 on which the sample 11 is mounted is moved. After the sample 11 is moved, by image recognition or the like this reference point 32 is detected and recognized and by a shifting method having good accuracy such as beam shifting the ion beam radiation position is corrected with the reference point as a reference as in FIG. 3c and working is carried out and continuous working of good accuracy accompanying stage movement is thereby possible. Also, this continuous working of good accuracy accompanying stage movement can also be applied not only to stage movement based on stage information accompanying individual working conditions but also in a case wherein an area exists in which working is to be carried out at a predetermined interval.

With this invention, continuous working accompanying stage movement of an accuracy of 0.1 μm or less becomes possible and increase of throughput is possible in working with a focused ion beam.

What is claimed is:

1. An ion beam working apparatus comprising:

an ion source for producing an ion beam, a lens system for focusing the ion beam, an electric variable multi-aperture for limiting the current of the ion beam, a stage on which a sample to be worked with the ion beam is mounted, a detector for detecting secondary particles arising when the ion beam is radiated onto the sample, an ion optical system control part for controlling the lens system and the electric variable multi-aperture according to a set of ion beam optical conditions, and a computer system for controlling working of the sample on the basis of the secondary particles, wherein a plurality of sets of ion beam optical conditions including setting of the lens system, astigmatism corrective values of the ion beam, aperture diameters and image shift amounts are stored in the computer, each set of ion beam optical conditions being determined by an ion beam current amount selected according to working area or working content, and wherein the apparatus is operable to select a set of stored ion beam optical conditions based on a desired ion beam current amount selected according to working area or working content, to set the ion source, the lens system and the electric variable multi-aperture according to the selected set of ion beam optical conditions, and to carry out the workings under the selected set of ion beam optical conditions.

2. In an ion beam working apparatus comprising an ion source for producing an ion beam, a lens system for focusing the ion beam, an electric variable multi-aperture for limiting the current of the ion beam, a stage on which a sample to be worked with the ion beam is mounted, a detector for detecting secondary particles arising when the ion beam is radiated onto the sample, an ion optical system control part for controlling the lens system and the electric variable multi-aperture, and a computer system for controlling working of the sample on the basis of the secondary particles, an ion beam working method comprising:

storing a plurality of sets of ion beam optical conditions including setting of the lens system, astigmatism correction values of the ion beam, aperture diameters and image shift amounts in the computer, each set of ion beam optical conditions being determined by an ion beam current amount selected according to working area or working content;

selecting a set of stored ion beam optical conditions based on a desired ion beam current amount selected according to working area and working contents;

setting the ion source, the lens system and the electric variable multi-aperture according to the selected set of ion beam optical conditions; and carrying out the desired workings under the selected set of optical conditions.

3. An improved ion beam working apparatus including an ion source for producing an ion beam, an ion beam optical system disposed in a path of the ion beam, and a control system including a computer for controlling the ion beam optical system, wherein the improvement comprises:

a storage in the computer for storing a plurality of sets of ion beam optical conditions, each set of ion beam optical conditions being determined by an ion beam current amount selected according to a type of working, wherein the apparatus is operable to select a set of stored ion beam optical condition based on a desired ion beam current amount selected according to the working, to set the ion source and the ion beam optical system according to the selected set of ion beam optical conditions, and to carry out the working under the selected set of ion beam optical condition.

4. The apparatus of claim 3, wherein the ion beam optical system comprises a focusing lens, an alignment electrode, a multi-aperture, an objective lens and an astigmatism correcting electrode, and wherein the ion beam optical conditions include values indicative of settings of at least one of the focusing lens, the alignment electrode, the multi-aperture, the objective lens and the astigmatism correcting electrode.

5. In an ion beam working apparatus including an ion source for producing an ion beam, an ion beam optical system disposed in a path of the ion beam, and a control system for controlling the ion beam optical system, the control system including a computer storing a plurality of sets of ion beam optical conditions, each set of ion beam optical conditions being determined by an ion beam current amount selected according to a type of working, a method of working a sample comprising:

selecting a set of stored ion beam optical condition based on a desired ion beam current amount selected according to the working;

setting the ion source and the ion beam optical system according to the selected set of ion beam optical conditions; and carrying out the working under the selected set of optical condition.

6. The method of claim 5, wherein the ion beam optical system comprises a focusing lens, an alignment electrode, a multi-aperture, an objective lens and an astigmatism correcting electrode, and wherein the step of carrying out the working comprises setting at least one of the focusing lens, the alignment electrode, the multi-aperture, the objective lens and the astigmatism correcting electrode according to the selected ion beam optical condition.

7. The method of claim 5, wherein the computer further stores information regarding a plurality of workings, and wherein the method further comprises repeating the selecting and carrying out steps for the plurality of workings.

8. A method of operating an ion beam working apparatus having an ion source for producing an ion beam, an ion beam optical system disposed in a path of the ion beam, and a control system including a computer for controlling the ion beam optical system, the method comprising:

(a) irradiating the ion beam on a sample;

(b) for each given type of working, adjusting a current of the ion beam irradiated on the sample based on the type of working by adjusting a condition of the ion beam optical system;

(c) observing the ion beam irradiated on the sample;

(d) adjusting optical properties of the ion beam based on the observed ion beam irradiated on the sample to optimize conditions of the ion beam optical system for each ion beam current; and (e) storing in the computer the optimized conditions of the ion beam optical system for each ion beam current.

9. The method of claim 8, further comprising repeating steps (b)–(e) for additional types of working.

10. The method of claim 8, wherein the optical properties of the ion beam includes focusing, alignment and astigmatism of the ion beam.

11. The method of claim 8, wherein the adjustment step (b) includes adjusting at least one of a focusing lens and a multi-aperture of the ion beam optical system, and wherein the adjustment step (d) includes adjusting at least one of an alignment electrode, an objective lens and an astigmatism correcting electrode of the ion beam optical system.

\* \* \* \* \*